United States Patent

Klank et al.

[11] 4,077,009
[45] Feb. 28, 1978

[54] TUNING CIRCUIT FOR HIGH FREQUENCY RECEIVERS

[75] Inventors: Otto Klank, Arpke; Dieter Rottmann, Misburg, both of Germany

[73] Assignee: Licentia Patent-Verwaltungs-G.m.b.H., Frankfurt (Main), Germany

[21] Appl. No.: 750,635

[22] Filed: Dec. 15, 1976

[30] Foreign Application Priority Data

Dec. 16, 1975 Germany .............................. 2556486

[51] Int. Cl.² .............................................. H04B 1/06
[52] U.S. Cl. .................................... 325/455; 325/419; 325/453; 325/459; 325/464; 325/468
[58] Field of Search ............................... 325/419–421, 325/452, 453, 455, 457, 458, 459, 464, 465, 468, 470; 358/191, 192

[56] References Cited

U.S. PATENT DOCUMENTS

| 3,961,266 | 6/1976 | Tanaka | 325/468 |
| 3,973,205 | 8/1976 | Tanaka | 325/464 |
| 3,988,681 | 10/1976 | Schurmann | 325/464 |
| 4,005,369 | 1/1977 | Parisoe | 325/455 |

Primary Examiner—Robert L. Griffin
Assistant Examiner—Jin F. Ng
Attorney, Agent, or Firm—Spencer & Kaye

[57] ABSTRACT

A tuning circuit for high frequency receivers including a superheterodyne oscillator whose frequency can be varied by a tuning voltage to tune in desired stations and a comparison circuit which produces the tuning voltage by comparing a first number representing the broadcast frequency to which the oscillator is tuned, produced by a counting device which periodically counts the oscillations of the superheterodyne oscillator under consideration of the intermediate frequency with a second number representing the desired received frequency fed in via an input keyboard with series-connected coder and the comparison circuit includes a single comparator suitable only for the comparison of but a single digit of the two numbers at one time and receives the digits of the two numbers to be compared in multiplex operation in succession beginning with the digit assigned the highest value. The counting result from the counting device is displayed on an optical display device controlled in the same multiplex operation as the comparator with the multiplex phase signals required for the multiplex operation of the comparison circuit being obtained from a regenerating circuit which is controlled by at least one synchronizing signal from the counting device and by at least one clock pulse signal appearing per multiplex signal of the display device, so that the resulting multiplex signals for the comparator occur synchronously or in synchronous rhythm with the multiplex signals for the display device. The clock pulse signal is obtained from a control circuit which is connected to the counting device and which circuit together with the regenerating circuit controls the sequence of the entire comparison circuit. Preferably the entire comparison circuit, including the control and regenerating circuit and the comparator is designed to be a single integrated circuit unit.

22 Claims, 14 Drawing Figures

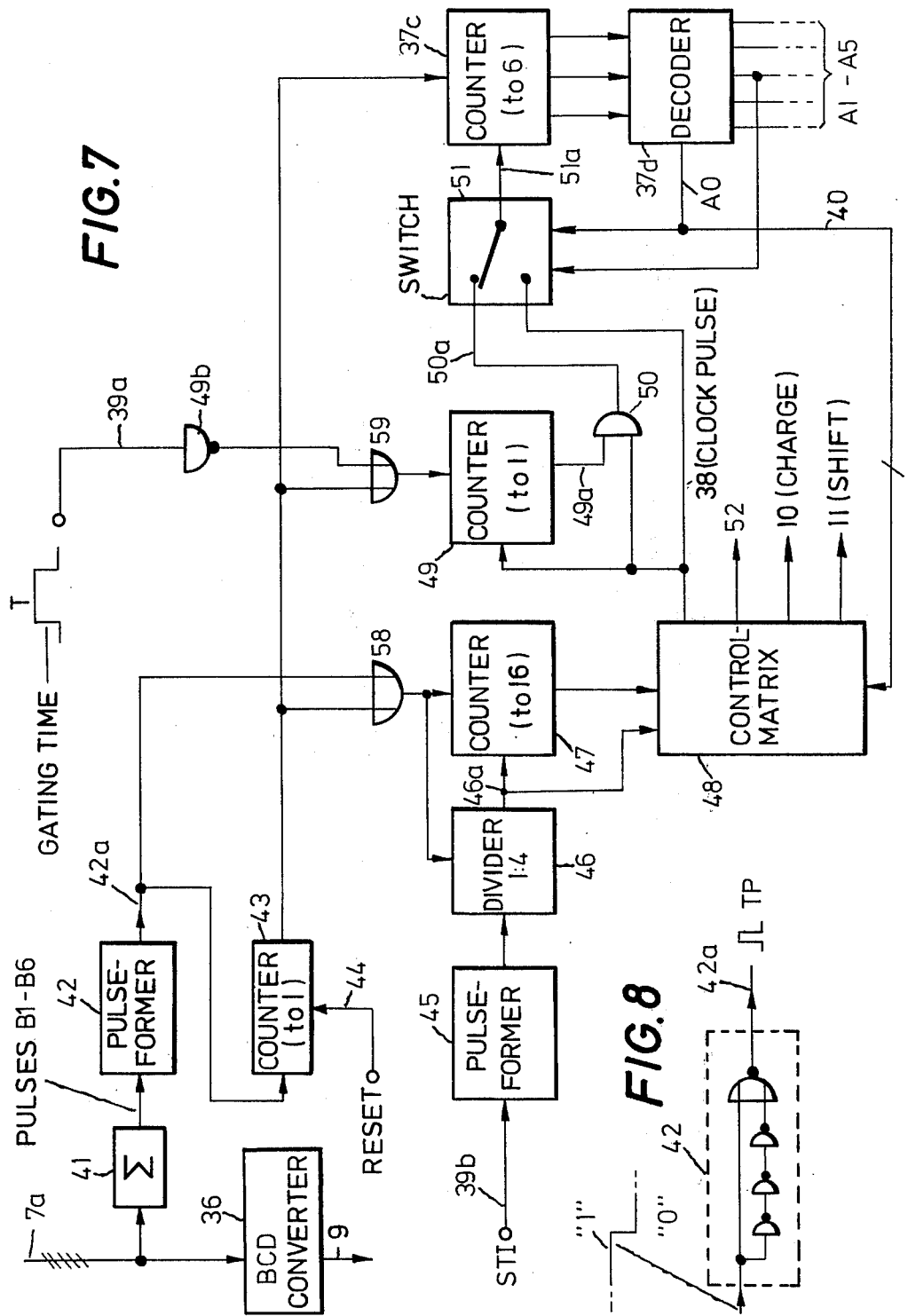

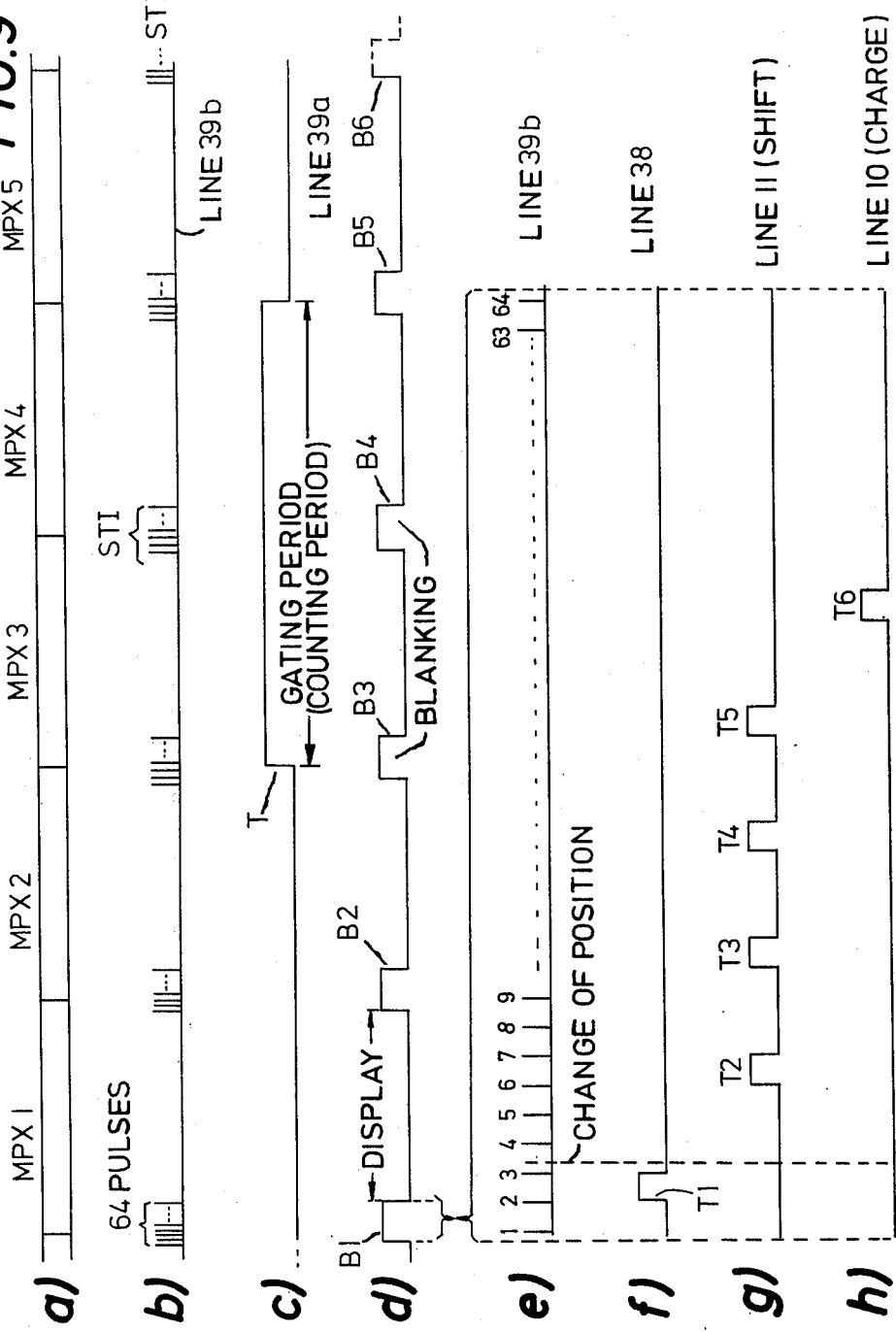

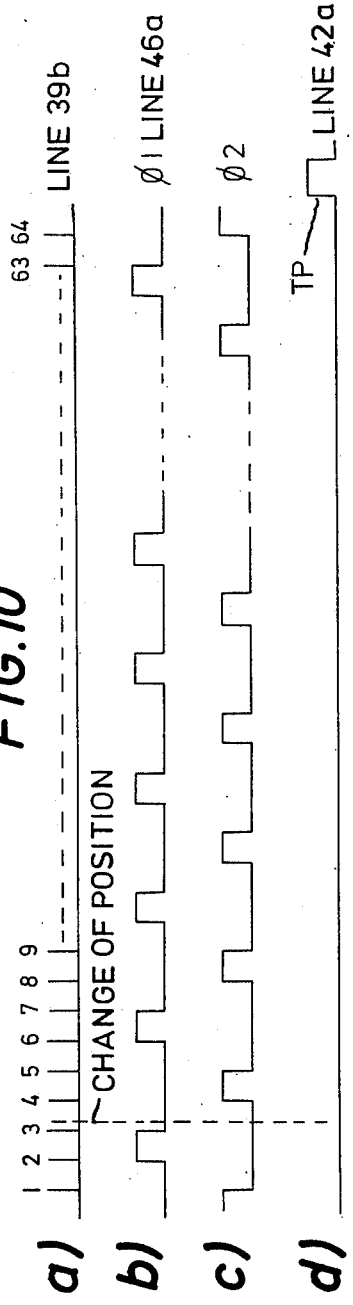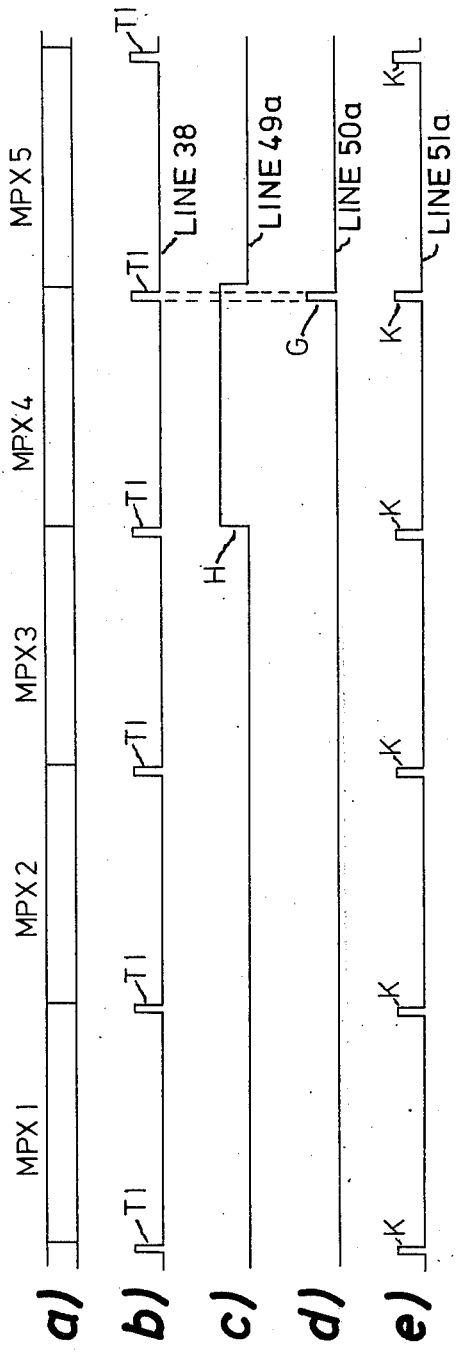
FIG.10
FIG.11

TUNING CIRCUIT FOR HIGH FREQUENCY RECEIVERS

BACKGROUND OF THE INVENTION

The present invention relates to an improved tuning circuit for high frequency receivers, particularly of the type employing a digital input keyboard for reading in of the desired tuning frequency and an electronic tuning adjustment.

Copending U.S. patent application, Ser. No. 708,754, filed July 26, 1976, by Otto Klank et al., the subject matter of which is hereby incorporated by reference, discloses a tuning circuit for a high frequency receiver including a superheterodyne oscillator whose frequency is variable by means of a supplied tuning voltage in order to tune the receiver to desired stations. The tuning circuit includes a comparison circuit which receives two numbers which are compared to produce the tuning voltage. One of these numbers represents the counting state of a counter which periodically counts the oscillations of the superheterodyne oscillator under consideration of the intermediate frequency, and thus constitutes the value of the received frequency. The other number is fed to the comparison circuit via an input keyboard with series-connected coder and represents the frequency of the station to which the receiver is to be tuned. From the deviation between the two numbers as determined in the comparison circuit, the tuning voltage is derived whereupon the set is tuned to the station represented by the number provided by the input keyboard.

The invention in the above-identified application basically resides in the fact that a single comparator is provided which is suitable for the comparison at one time, of only one digit of the two numbers. This comparator receives the digits of the two numbers to be compared in succession in multiplex operation beginning with the digit having the greatest significance. Multiplex operation results in the advantage, inter alia, that only few connecting lines are required to connect the comparison circuit. This is of advantage if the comparison circuit is realized in the integrated MOS technique where there exists the desire to keep the number of connecting terminals for the integrated circuit as low as possible.

In the above-identified application in which the received frequency is also indicated on a display device operating in the same multiplex mode, the multiplex phase signals required for comparison of the two numbers are obtained directly from the multiplex phase signals for the display device. These signals actuate in timely succession the display elements provided for the individual digits of the number to be displayed so that a digit can be displayed thereon. There now often exists the necessity to not actuate one or even several of the provided display elements because, for example, in accordance with the frequency band involved, the number involved has only four digits or leading zeroes are to be blanked out although a total of five display elements, for example, are provided. Such blanking out would not be possible, however, if the multiplex phase signals for the display device were simultaneously to be used also for the comparison circuit since the signals for controlling the comparison circuit would then be incomplete.

In the above-identified application in addition to the multiplex phase signals, other signals required by the comparison circuit are obtained likewise from the counting device, thus requiring a relatively large number of connecting lines leading from the counting device to the remainder of the tuning circuit. This is a drawback, however, particularly if the comparison circuit is to be realized as or part of an integrated MOS circuit (IC). In this case it is necessary for the IC to have a relatively large number of external terminals which makes its production more expensive.

SUMMARY OF THE INVENTION

It is the object of the present invention to modify the tuning system of the type disclosed in the above-identified application Ser. No. 708,754 to permit operation of the comparison circuit in spite of the above-mentioned blanking and to require as few connecting lines as possible between the counting device and the comparison circuit.

The above object is achieved according to the present invention in that in a tuning circuit for a high frequency receiver, which circuit includes a voltage controllable superheterodyne oscillator whose frequency can be varied by a tuning control voltage to produce an oscillation which determines the broadcast frequency to which the receiver is tuned, an optical digital indicator means for displaying the broadcast frequency to which the receiver is tuned, a counting means for periodically counting the oscillations of the oscillator to produce a count state in the form of representations of the digits of a first decimal number identifying the broadcast frequency to which the receiver is tuned and for supplying same in time multiplex to the display device, input means for generating representations of the digits of a second decimal number identifying the broadcast frequency to which it is desired to tune the receiver; and a comparison circuit means for comparing the first and second decimal number representations and for producing a control voltage for the oscillator from the comparison to cause the first decimal number representation to coincide with the second decimal number representation and with the comparison circuit means including a single comparator capable of comparing, at one time, only the representations of one digit of each of the first and second numbers, and a time multiplex means, responsive to control signals from the counting means, for delivering to the comparator in succession, each digit representation produced by the counter, starting with the most significant digit, and simultaneously therewith, each digit representation of corresponding significance generated by the input means so that the display means and the comparator are controlled in synchronism; the multiplexing means comprises: a regenerating circuit means for generating the multiplying signals required for the multiplex operation of the comparison circuit means, with the regenerating circuit means being controlled by a synchronizing signal from the counting means and by at least one clock pulse signal appearing per multiplex signal for the display means; and an auxiliary circuit means, which together with the regenerating circuit means controls the sequence of operation of the entire comparison circuit means; the entire comparison circuit means including the regenerating circuit means, the auxiliary control circuit means and the comparator being designed as a single circuit unit.

In the present invention the multiplex phase signals required for the comparison circuit are thus no longer obtained directly from the multiplex phase signals for the display device, but are obtained by regenerating in a regenerating circuit. This circuit is controlled by pulses occurring with every multiplex phase signal from the display device and by a sync signal which is, for example, a multiplex phase signal for the display device which is not affected by blanking. All that is required here is, for example, a connecting line for the sync signal branching off from the display device so that only one terminal is required in a tuning circuit in the form of an MOS circuit if the regeneration circuit is disposed within the tuning circuit. The above-mentioned pulses which occur with every multiplex phase signal can here be obtained from an auxiliary or control circuit additionally provided in the present invention which also produces other signals required for the proper functioning of the entire comparison circuit and together with the regenerating circuit makes the entire comparison circuit operable. The auxiliary or control circuit may be actuated by means of a plurality of control signals from the counting device via, for example, only a single connecting line. Without this auxiliary circuit more connecting lines would be required between the counting device and the comparison circuit, which also includes the auxiliary circuit, than in the present invention which would require additional terminals if the comparison circuit is to be realized as an MOS circuit. The present invention thus results in a reduction of the number of terminals in the case where the comparison circuit together with the above-mentioned regenerating circuit and the auxiliary circuit are designed as integrated circuit.

The regenerating circuit and the auxiliary circuit do involve additional expenditures. However, it has been found that the costs for this are substantially less, if the integrated circuit design is employed, than if additional terminals would have to be provided.

BRIEF DESCRIPTION OF THE DRAWINGS

FIG. 7 is a block circuit diagram of an embodiment of the auxiliary circuit and another embodiment of the regenerating circuit for the circuit of FIG. 2.

FIG. 8 is a logic circuit diagram for the pulse former circuit of FIG. 7.

FIGS. 9 to 11 are pulse diagrams showing the operation of the circuit of FIG. 7.

DETAILED DESCRIPTION OF THE PREFERRED EMBODIMENTS

Figure 1:
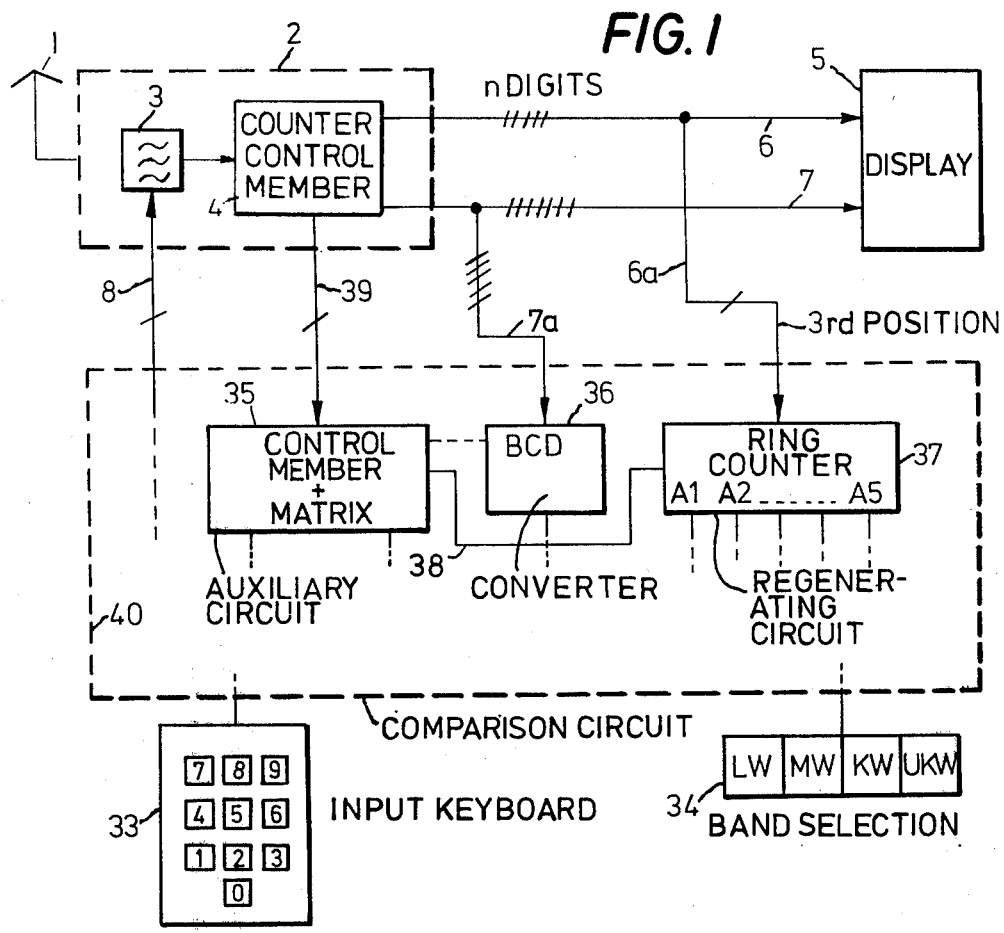
FIG. 1 is a basic simplified block circuit diagram of a high frequency receiver including a tuning circuit according to the present invention.

FIG. 1 shows the basic circuit arrangement according to the invention which basically includes a high frequency receiver 2 and a comparison circuit 40 which compares the frequency of the received signal with the desired frequency inserted through an input keyboard 33 and produces a tuning voltage for the high frequency receiver 2 from the result of the comparison. The high frequency receiver 2 may be, for example, a radio receiver or a television receiver. The following description is based on a radio receiver.

An antenna 1 feeds the received high frequency oscillations to the radio receiver 2 which includes inter alia, a superheterodyne oscillator 3 which produces an intermediate frequency oscillation. The superheterodyne oscillator 3 is provided with a variable capacitance diode (not shown) so that the oscillator frequency can be varied by means of a tuning voltage fed to the variable capacitance diode via a line 8 to tune the receiver to the desired station. Also provided in the receiver is a counting device 4 which includes a counter and a control member. The counter in a known manner, counts the oscillations of the superheterodyne oscillator 3 under consideration of the intermediate frequency so that the counter state of the counter indicates the received frequency. Such a counting circuit for counting the oscillations of the oscillator frequency, and which permits digital frequency indication, is disclosed, for example, in the periodical, "Radio Mentor" 1973, pages 389–390 and the periodical "Funk-Technik" 1971, pages 157–159. For realizing the counter and control member 4, the known integrated circuit AY-5-8100 (General Instrument Corporation) can be used. This integrated circuit supplies signals which are needed for the following described time multiplex operation and signals on the line 39.

Digital frequency display is provided in FIG. 1 by a display device 5 on which the digits are displayed, for example, by means of so-called seven-segment display elements. The digital frequency indication on the display device 5 is effected in a time multiplex operation provided by a control portion of counting device 4. Therefore, the segment information for only one digit at a time is transmitted via connection 7 from the counting device 4 to the display device 5. Via a connection 6 between counting device 4 and the display device 5, the display device 5 is informed to which position the digit transmitted via connection 7 is assigned. The individual digits are displayed by the device 5 in such rapid succession that the observer gains the impression of a simultaneous display of all digits.

Figure 3:
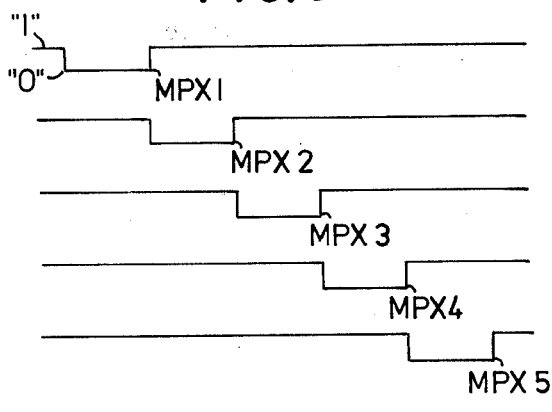
FIG. 3 is a pulse diagram of the multiplex signals for the circuit of FIG. 1.

In FIG. 1 the slanted lines or connections 6 and 7 indicate the number of connecting lines contained in this connection, and this type of notation is utilized in the remaining figures as well. Connection 6 thus contains five connecting lines and connection 7 contains seven connecting lines. The multiplex control for display device 5 taking place via connection 6 is shown in FIG. 3. The multiplex phase signal MPX 1 represented by a logic "0" is assigned to the first digit, multiplex phase signal MPX 2 is assigned to the second digit, etc. When the display device 5 is actuated by the signal MPX 1 the first digit (first position) whose value is transmitted via connection 7 can be displayed. The same applies for the other MPX signals, MPX 2 to MPX 5. It is also possible, however, to display the MPX signals by a logic "1" pulse, in deviation from what is shown in FIG. 3. Each one of the multiplex phase signals MPX 1 to MPX 5 thus indicates the time duration within which the position assigned to a particular digit is displayed. The multiplex phase signals MPX 1 to MPX 5 shown in FIG. 3 are produced in a known manner in the control member which is part of counting device 4. Likewise in a known manner, the counting device 4 also converts the counting state of the counter counting the oscillator oscillations into the 7-segment code required for the display device.

Reverting to FIG. 1, for tuning the receiver to the desired station, an input keyboard 33 with keys for the decimal numbers zero to nine is provided. The desired frequency band is selected by a band selector 34 which includes keys assigned to the receiving bands LW (long wave), MW (medium wave), KW (shortwave) and UKW (VHF). If, for example, a station with a frequency of 87.6 MHz is to be selected, the VHF key of band selector 34 is actuated and then the digits eight, seven, six and zero are entered in succession via input keyboard 33. In comparison circuit 40 the number fed in by input keyboard 33 is compared digit by digit with the number representing the received frequency produced by counting device 4. A tuning voltage is produced from the result of the comparison and fed to the superheterodyne oscillator 3 via line 8 to vary its frequency so that the station identified by the fed-in number is received.

It has already been mentioned that the comparison of the two numbers is effected by means of comparison circuit 40 in the same multiplex operation also provided for the display device 5. The comparison circuit 40 therefore also requires the multiplex signals MPX 1 to MPX 5 shown in FIG. 3. In the above-mentioned application, Ser. No. 708,754 these multiplex signals are obtained directly from connection 6 which requires five connecting lines leading to the comparison circuit 40. If the comparison circuit 40 is an integrated MOS circuit (MOS-IC), which is indicated in FIG. 1 by the dashed outline, this would require five terminals for the circuit 40 which would make realization as an integrated circuit difficult.

According to the present invention, the number of terminals required is reduced by providing a regenerating circuit 37 within the comparison circuit 40 with the regenerating circuit 37 being synchronized via a line 6a, for example, by an MPX signal for the display device 5 and controlled by a pulse from the auxiliary or control circuit 35. The regenerating circuit 37 produces the five multiplex phase signals MPX'1 to MPX'5 required for the multiplex operation of the comparison circuit. Since these multiplex phase signals are signals which are derived from the multiplex phase signals MPX of the display device 5, they are identified as MPX'1 to MPX'5 to provide differentiation and are synchronous with the multiplex phase signals from the display device 5 but need not be of the same phase with same. The regenerating circuit 37 may be designed, for example, as a ring counter at whose outputs A1 to A5 the desired multiplex signals MPX' appear. An embodiment of a regenerating circuit 37 designed in this manner will be described below in connection with FIG. 4.

The comparison circuit 40 further includes an auxiliary or control circuit 35 which comprises, inter alia, a control portion and a matrix and controls the regenerating circuit 37 via the line 38 with the above-mentioned clock pulse. This auxiliary or control circuit 35 also serves to generate further signals required for the operation of the comparison circuit 40. In the above-mentioned application, Ser. No. 708,754 these signals are obtained directly from the counting device 4 which may again require additional connections if the comparison circuit 40 is designed as an integrated MOS circuit. In the present invention, however, it is sufficient to control the auxiliary circuit 35, for example, via a line 39, with a plurality of control pulses. From the control signals arriving through line 39, the auxiliary circuit 35 produces the other signals required for operation of the comparison circuit 40 as will be described below in connection with FIGS. 7 to 12.

Since the comparison of the two numbers within comparison circuit 40 is effected in such a manner that the two numbers are each represented in a BCD code, but the digital information for the number to be displayed on display device 5 is present in a seven-segment code, a converter 36 having its input connected via connection 76 to the connection 7, is provided in the comparison circuit 40 to convert the seven-segment code for the display device 5 to the BCD code.

Figure 2:
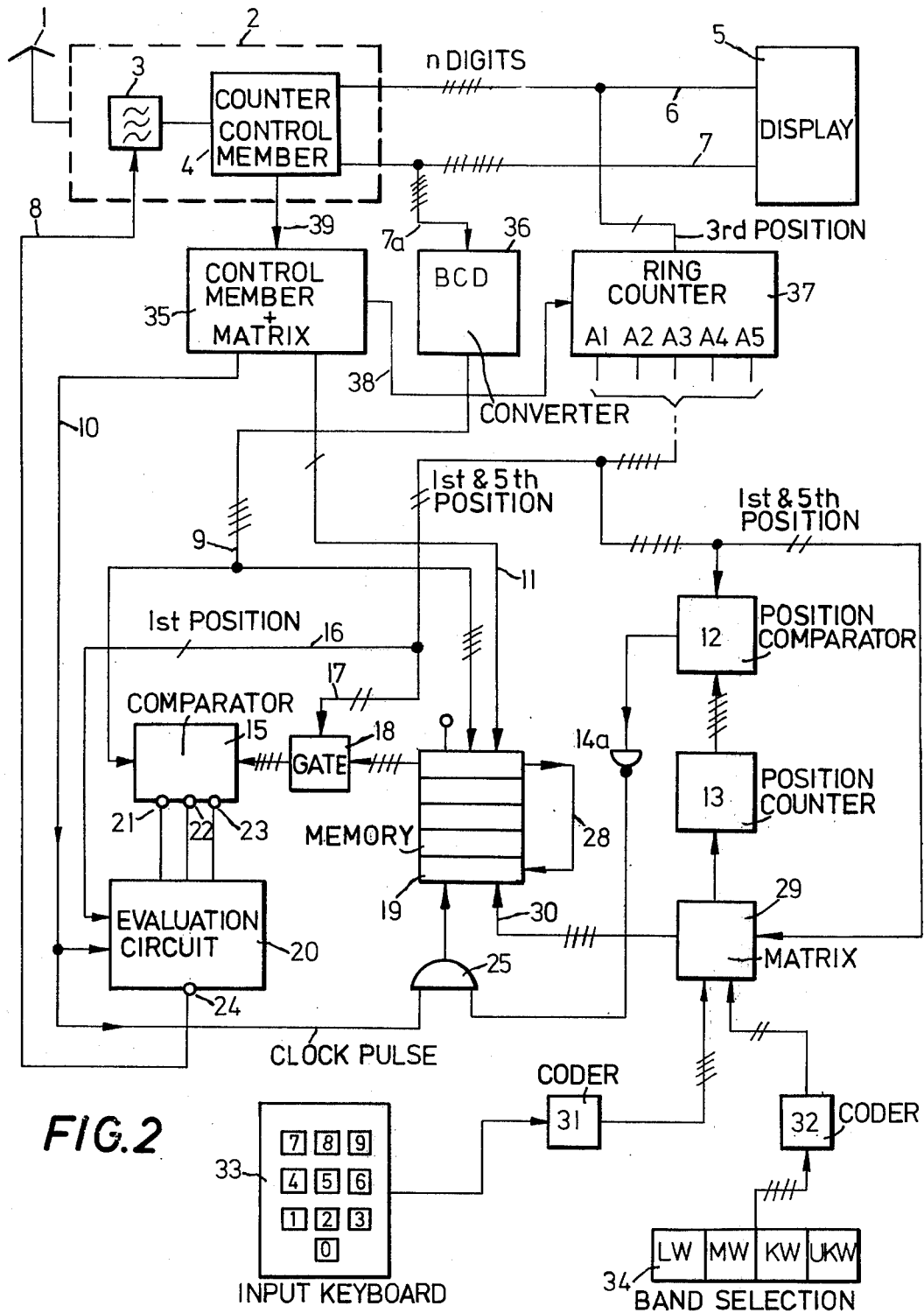
FIG. 2 is a detailed block circuit diagram of the receiver shown in FIG. 1 showing a preferred embodiment of the tuning circuit according to the invention.

FIG. 2 is a basic circuit diagram in which the comparison circuit 40 of FIG. 1 is shown in more detail. In FIG. 2, the same parts as those in FIG. 1 bear the same reference numerals. Since the comparison of the two numbers in multiplex operation in the single digit comparator 15 as well as the development of the tuning voltage in the evaluation circuit 20 have already been described in detail in the above-mentioned application Ser. No. 708,754, they will hereinafter be discussed only in principle inasmuch as is required for understanding of the present invention.

For the comparison, the comparator 15 receives, on the one hand, the counter state of the counter in counting device 4 and, on the other hand, the number punched in through the input keyboard 33. Comparator 15 compares, in succession, the digits of the two numbers it receives, digit by digit, all of the digits being represented in BCD code. Since the digits representing the counter state appear in connection 7 one after the other in a seven-segment code, BCD converter 36 is provided which feeds these digits in succession to comparator 15 in BCD code. The other number fed in via input keyboard 33 is also converted to the BCD code by coder 31 and fed to a logic circuit hereinafter called a matrix 29. At the same time matrix 29 receives the frequency band information fed in via band selector 34 in a coded form, the coding being effected by coder 32.

From matrix 29, the binary words representing the fed-in digits reach via connecting lines 30 a dynamic memory 19 which may include, for example, five 4-bit memory cells. With a charging pulse from AND gate 25, whose output is connected to the associated setting input of the first memory cell of memory 19, the digit coming from matrix 29 is transferred at a given moment in time to the first memory cell, i.e., the lowermost memory cell in FIG. 2. During every multiplex phase, this digit is shifted to the next following memory cell so that after four phases it has arrived in the fifth memory cell, i.e., the uppermost memory cell in FIG. 2. This shifting from one memory cell to the next-following memory cell is accomplished by dynamic memory 19 via clock pulses received through line 11. These clock pulses, of which four occur during every multiplex phase, are obtained from auxiliary circuit 35. From the fifth memory cell, the digit travels to comparator 15 via a gate circuit 18.

For proper operation it is necessary that comparator 15 always compares the corresponding positions or digits of the two numbers being compared. If, for example, comparator 15 receives the first position or digit from BCD converter 36, it must also receive the first position or digit of the fed-in number via gate 18. The transfer of the fed-in digits into memory 19 must thus take place at a quite defined moment in time. The correct association of the positions fed into comparator 15 is accomplished by a position comparator 12 which is controlled by a position counter 13 and by the multiplex signals produced by the regenerating circuit 37. The position comparator 12 emits a signal to AND gate 25 whenever the position fed to comparator 15 and the position fed to the first memory cell of dynamic memory 19 from matrix 29 differ from one another by four positions. This difference of four positions has been selected because the digit transferred into the first memory cell is transferred to the fifth memory only after four positions (i.e., four multiplex phase signals) from where it is fed to comparator 15. If thus the digit is in the fifth memory cell of dynamic memory 19, the corresponding position of the other number will at the same time be fed to comparator 15.

The transfer into the dynamic memory 19 can be effected only if the AND conditions for AND gate 25 are met. The one AND condition is given by the position comparison and the position shift by four positions and determined by position comparator 12. A further AND condition for gate 25 is met in that the AND gate 25 receives via line 10 a clock pulse from auxiliary circuit 35 with every multiplex phase signal.

The dynamic memory 19 is provided with a feedback 28 from the output of its fifth memory cell to the input of its first memory cell so that the number fed in through the input keyboard 33 continues to circulate in dynamic memory 19 and is continuously available for comparison.

Gate 18 is actuated via a connection 17 to the outputs of the regenerating circuit or ring counter 37 corresponding to the multiplex signals for the first and the fifth position so that during the first and fifth positions only two bits travel through gate 18 to comparator 15 and the other two bits have the value zero. The digits of the first and fifth positions can be identified already by two bits because these positions do not require all numbers from zero to nine but only two different numbers, for example (e.g., 1 and 2 or 0 and 5). Since, due to the BCD code employed, four bits are available per position, the two remaining bits of the first and fifth positions can be used for identifying the frequency band selection.

The comparator 15 is provided with three outputs 21, 22 and 23 which are connected with an evaluation circuit 20. The evaluation circuit 20 whose function has been described in detail in the above-identified application, Ser. No. 708,754, is controlled via line 10 by the auxiliary circuit 35 by means of a clock pulse which occurs once in every MPX phase. Moreover, it is actuated by means of the multiplex phase signal of the first position MPX'1 via line 16. At the output 24 of the evaluation circuit 20 a tuning voltage appears which is fed via a line 8 to the superheterodyne oscillator 3 and varies its frequency in the desired sense.

Figure 4:
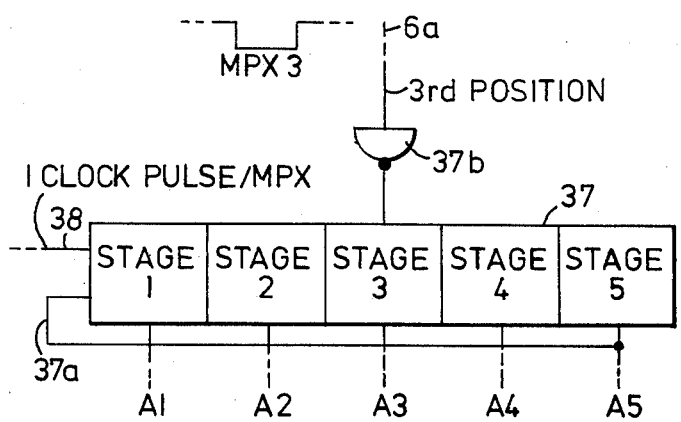
FIG. 4 is a block circuit diagram illustrating an embodiment of a regenerating circuit according to the invention.

FIG. 4 shows the embodiment of a regenerating circuit for the circuit of FIG. 2. The regenerating circuit basically is a shift register 37 which has five stages and a feedback 37a from the fifth to the first stage. The outputs of the stages are marked A1 to A5. Via line 38 the shift register 37 receives a clock pulse with every MPX signal (see FIGS. 9f and 11b), the clock pulse being obtained from auxiliary circuit 35. Through connection 6, through which the MPX signals are fed to the display device 5 the third stage of shift register 37 is charged with the inverted multiplex phase signal MPX 3 via inverter 37b. The MPX signal MPX 3 which is assigned to the third position was selected because the third position is displayed for all receiving bands and no blanking is provided in this position. Thus during the third position a logic "1" appears at the output A3 of the third stage of shift register 37 while the other stages are at logic "0". With the next clock pulse this "1" is transferred into the fourth stage and with the next clock pulse moves to the fifth stage. With the next-following clock pulse it is transferred from there via the feedback 37a into the first stage, etc. Thus during every multiplex phase the potential logic "1" appears consecutively in time — corresponding to a "1 of 5 code" — at every one of the outputs A1 to A5. This produces the desired MPX' phase signals as they are shown, for example, in FIG. 3. The MPX' signals shown in FIG. 3 are identified with logic "0" while in FIG. 4 they are shown as "1" potential. This difference is insignificant, however, since it would be possible to realize a reversal by using inverters.

Figure 5:
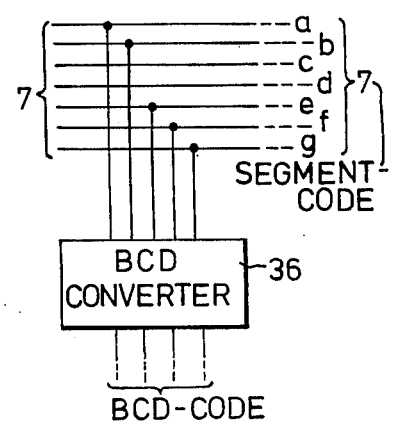
FIG. 5 illustrates the connection of a BCD converter to convert a seven-segment code into a BCD code.
Figure 6:
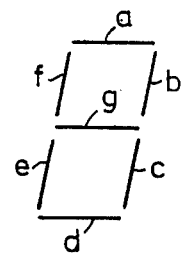
FIG. 6 illustrates the identification of the segments in a seven-segment display for a digit.

An advantageous feature of the present invention will now be explained with the aid of FIGS. 5 and 6 where the BCD converter 36 is controlled only by five segment informations. The segments employed in the seven-segment code are marked $a - g$ and their relationship to a seven-segment bar display is shown in FIG. 6. FIG. 5 is based on the realiziation that it is possible to differentiate the numbers 0 - 9 if only the five segments $a,b,e,f,$ and $g$ are evaluated. The segment informations $c$ and $d$ are thus not required to convert, at the output of BCD converterer 36, the digit present in connecting lines 7 in seven-segment code to a digit in BCD code. Thus only five, and not seven, terminals are required for the comparison circuit 40.

FIG. 7 illustrates the structure of a preferred embodiment of the auxiliary circuit 35 of FIG. 2, the already discussed BCD converter 36 and a further embodiment of the regenerating circuit 37 which is here formed by a counter 37c with series-connected decoder 37d. For a better understanding of the circuit of FIG. 7 the pulse diagrams of FIGS. 9 to 11 are provided to which reference will be made below in connection with the description of FIG. 7.

As shown in FIG. 7, the five segment informations fed to BCD converter 36 via connection 7 are also fed to a summing circuit 41 which forms a sum signal therefrom to be fed to a pulse former 42. As control signals there are available in line 39a the gating signal T which determines the gate period of counting device 4 (period during which the oscillations of superheterodyne oscillator 3 are counted during the third and fourth position) and control pulses STI on line 39b which are shown in FIGS. 9b and 9c. In this portion of the circuit the above-mentioned segment informations are required only as start information when the circuit is connected initially to the operating voltage and as correction signals upon the occurrence of incomplete pulse series in control pulses STI.

The control pulses STI obtained from counting device 4 per MPX phase are fed to a pulse former 45 to be shaped into a system clock pulse and then are fed to a divider 46 having a dividing ratio of 1:4. At the output 46a of divider 46 there appear the clock pulses 01, 02 shown in FIGS. 10b, 10c, in 16 pairs. Pulses 01 and 02 are clock pulses of a multiphase system where 01 contains the information and at 02 it is executed (corresponding to TTL "0"–"1" and "1"–"0" edge). The clock pulses 01 are counted by a counter 47 whose counting capability is 16. The counter outputs of counter 47 are connected with a control matrix 48 which forms the various required clock pulses T1 to T6 from the various counter states.

The control matrix 48 produces a clock pulse T1 (see FIGS. 9f, 11b) per MPX' phase which is fed via line 38 to a counter 49 and to a switch 51. Moreover, the control matrix 48 provides, during every MPX' phase, a clock pulse T6 via line 10 for charging the above-mentioned first memory cell of dynamic memory 19. Control matrix 48 also produces shift pulses T-2 – T5 (four per MPX' phase; see FIG. 9g) with which the digits stored in BCD code are shifted into the respectively next-following memory cell of dynamic memory 19. Via a further line 52 further required clock pulses can be obtained if required (e.g. for erasing the segment information).

Figure 13:
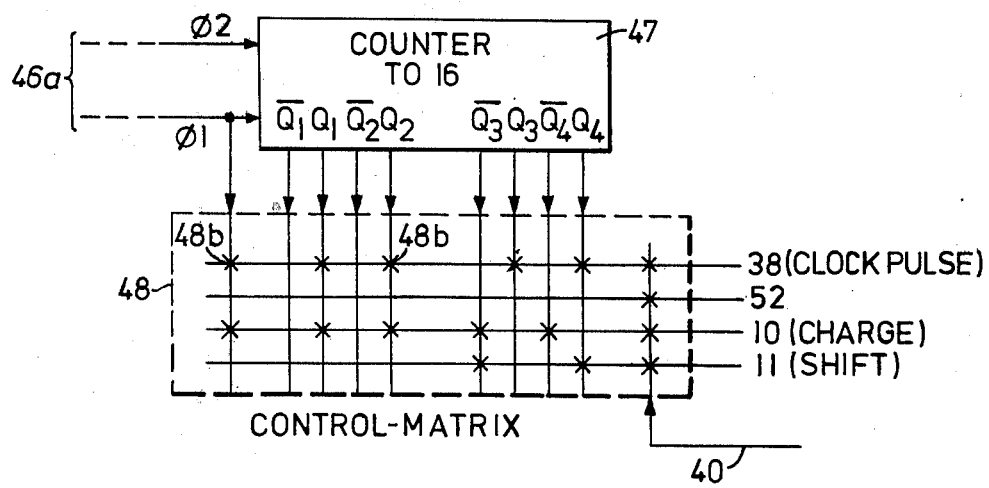
FIG. 13 is an embodiment of the control matrix 48 of FIGS. 7 and 12.

In FIG. 13 is shown an embodiment of the control matrix 48. The connection 46a comprises two lines to feed the pulses 01 and 02 to the counter 47. To produce the above mentioned pulses the control matrix 48 is steered forward with the pulse 01, the output signals of the counter 47 and with a pulse from the decoder 37d (via line 40). The function of this pulse from the decoder 37d is to block the outputs of the control matrix 48 for a limited time after switching on the receiver 2. Thereafter this pulse is without meaning, so that the above mentioned pulses present on the lines 10, 11, 38 and 52 are produced only by the 01-pulse and the counter state of the counter 47 with the output terminals $\overline{Q}_1$, $Q_1$, $\overline{Q}_2$, $Q_2$, $\overline{Q}_3$, $Q_3$, $\overline{Q}_4$ and $Q_4$.

Figure 14:
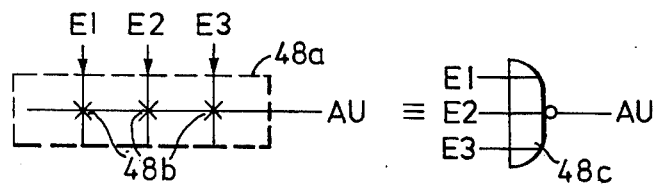
FIG. 14 illustrates the meaning of the cross points of FIG. 13.
Figure 12:
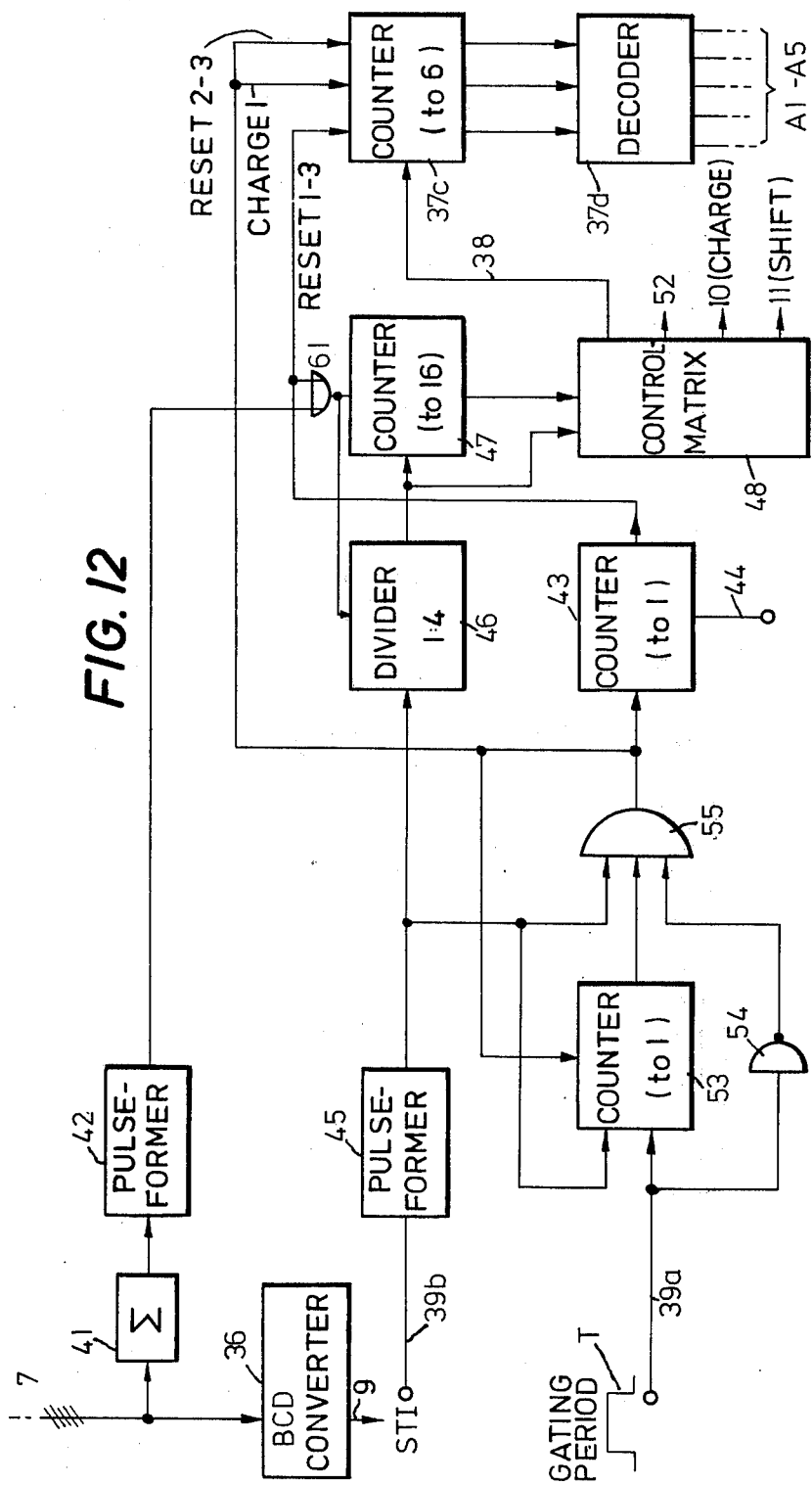
FIG. 12 is a block circuit diagram illustrating another embodiment of the auxiliary circuit and the regenerating circuit according to the invention.

As shown, the control matrix 48 contains cross points 48b to combine the input signals in the desired manner. To explain the meaning of the cross points 48b FIG. 14 shows that three of them (circuit 48a) form a NOR-gate 48c with inputs E1, E2, E3 and an output AU. Each cross point represents in practice a transistor, whereby the input lines are the gate-terminals. The cross points in FIG. 13 are so arranged that the desired pulses are present on the lines 10, 11, 38 and 52 of FIG. 7.

The circulation of positions for display device 5, where the positions circulate within comparison circuit 40, is synchronized by the counter 49 and switch 51. As shown, the gating signal T for the counting device 4 on line 39a is fed to the blocking input of the counter 49 via an inverter 49b and an OR gate 59. The clock pulses on line 38 are fed to one contact of a switch 51, to the counting input of counter 49 and to one input of an AND gate 50 whose other input is connected to the output 49a of counter 49 and whose output is connected to a second input of switch 51. With this arrangement counter 49, in synchronism with gate signal T, permits a single pulse T1 to pass through AND gate 50 during one cycle of five MPX phases. This counting pulse reaches the counting input of counter 37c via switch 51, which is dependent upon the state of counter 37c, only if the MPX and MPX' phases circulate in synchronism, which normally indicates a seamless succession of T1 clock pulses in line 51a.

Counter 37c, which together with decoder 37d forms the regenerating circuit, produces the MPX' signals. The three outputs of counter 37c, which is designed according to the Johnson principle, form a maximum of six different states which are assigned individually to outputs A0 – A5 via decoder 37d so that the counter state zero puts a "1" at the decoder output A0. The other assignments are: counter state one $\triangleq$ A4, two $\triangleq$ A5, three $\triangleq$ A1, four $\triangleq$ A2, five $\triangleq$ A3. Counter 37c normally receives the counting pulses in line 51a via clock pulse line 38. If the state "1" has been reached at decoder output A0 or A3, switch 51 is switched to path 50a and thus synchronization is enforced if the MPX'3 position is not in synchronism.

After initially switching on the operating voltage, counter 37c is at counter state zero, a special position which in the following cycles is skipped and occurs only once at the start. Due to this special position, a signal appears on output A0 of decoder 37d so that switch 51 is switched by decoder 37d via line 40 to line 50a so that counter 37c operates in synchronism at once. With this special position of the counter state zero of counter 37c, and due to the connection of line 40 to matrix 48, the clock pulses in lines 10, 11, 52 of control matrix 48 are also blocked. This arrangement is provided to prevent uncontrolled pulses from destroying memory informations for example by errors in writing in or reading out, at the start of the operation, i.e., when the operating voltage is switched on.

Reference is made now to FIG. 9d to explain the pulse formation via sum gate 41 and pulse former 42. Since the segment informations are intermittently blanked between the MPX phases and at least one segment information is always present thereafter (even at a zero display or with blanked digits) the pulses B1 – B6 appear at the output of the sum gate 41. These pulses comprise the sets of 64 control pulses STI as they are shown in FIG. 9c.

Pulse former 42 responds to the always present ones of pulses B1 to B6 and produces a short "1" pulse with which dividers 46 and 47 are set to zero via OR gate 58 after each set of 64 control pulses. This results in additional synchronization of both dividers 46 and 47 each time to the zero state per MPX phase. Normally both dividers 46 and 47 divide exactly 1:64 so that after every 64 STI pulses, i.e., after one MPX phase, the zero state has again been reached.

Counter 43 which now counts to one is set to zero upon the application of the operating voltage by a voltage dependent reset circuit connected to line 44 and blocks all shift register cells. Counter 43 is not set until after the first interval pulse TP at output 42a of pulse former 42 and is kept in this state. This assures that the next following set of 64 control pulses STI is complete.

An embodiment of the pulse former 42 of FIG. 7 is shown in FIG. 8. As can be seen, when the potential changes from logic "1" to logic "0" at the input of pulse former 42, a short "1" pulse TP appears in its output line 42a. The pulse duration of this short pulse TP is determined by the delay period of the three series connected inverters of pulse former 42.

For better understanding of FIG. 7 the corresponding pulse diagrams are shown in FIGS. 9 to 11. FIG. 9a shows, so-to-speak as a time scale, the five multiplex signals MPX 1 to MPX 5. Within the time duration of each multiplex signal one digit is displayed on display device 5 and two associated digits are compared with one another by comparator 15. FIG. 9b shows the control pulses STI which occur in sets of 64 pulses. FIG. 9c shows the gating pulse T, i.e., the pulse which determines the counting period within which counting device 4 counts the oscillator oscillations of the superheterodyne oscillator 3. The gating period is, for example, 10 ms and appears here together with the position signals of the third and fourth positions. In FIG. 9d the above-mentioned pulses B1 to B6 are shown which begin always shortly before the start of a multiplex signal and end somewhat after the start of the multiplex signal.

For better clarity, the time scale has been somewhat expanded in FIGS. 9e through 9h. The pulses shown there occur within the time duration of each pulse B1 to B6. FIGS. 9e shows that of the 64 control pulses STI, the first three lie directly before each change in position, i.e., immediately before the onset of a multiplex signal. The other sixty-one of the total of 64 control pulses STI occur directly after each change in position. FIG. 9f shows the clock pulse T1 which occurs shortly before the onset of a new multiplex signal and is fed to the regenerating circuit 37 via line 38 or 50a. The four shift pulses T2 to T5 occurring per MPX signal with which the digits are shifted in dynamic memory 19 are shown in FIG. 9g. Finally, FIG. 9h shows the charging pulses in line 10 for transferring the digits into the first memory cell of dynamic memory 19.

In FIG. 10 the clock pulses 01 and 02 produced by divider 46 are shown at b and c respectively. For better understanding the 64 control pulses STI are again shown as a measure of time in FIG. 10a.

Further pulse diagrams are shown in FIG. 11 where — as partially shown in FIG. 9 — the MPX signals are shown as a measure of time to show the time association of the pulses. FIG. 11b again shows the clock pulses T1 occurring each time directly at the end of the multiplex signals which, as explained above, control the regenerating circuit 37 via line 38. FIGS. 11c and 11d show the pulses in lines 49a and 50a, respectively. It can here be seen that a pulse G passes through line 50a to switch 51 only if the AND conditions for AND gate 50 of FIG. 7 are met. Finally, in FIG. 11e, the counting pulses K can be seen which are fed to counter 37c via line 51a and which are identical with pulses T1.

FIG. 2 shows another embodiment of auxiliary circuit 35 of FIG. 2 which is different from that of FIG. 7. Corresponding parts bear the same reference numerals in FIGS. 7 and 12. The embodiment of FIG. 12 differs from that of FIG. 7 in the manner of synchronization. The counter 53, which counts to one, together with AND gate 55 and inverter 54 forms a block to one, together with AND gate 55 and inverter 54 forms a block which permits only the first pulse after one of the two switching edges of gating pulse T to pass. Counter 53 is set, for example, during the third or fourth position (MPX 3, MPX 4) by any desired control pulse STI. Only the first control pulse STI after the start of multiplex signal MPX 5 — i.e., the fourth control pulse of the total of 64 control pulses STI — can then pass through AND gate 55. Directly thereafter the counter 53 is at once set to "Reset" by the output of AND gate 55 and thus AND gate 55 is blocked. The above-mentioned pulse at the output of AND gate 55 simultaneously charges the first cell of counter 37c and sets the other cells to zero. With one clock pulse per MPX phase, counter 37c is switched on and is set once per cycle to the rated state in the above-described manner. Principally, the circuit of FIG. 12 produces the same pulses as the circuit of FIG. 7, but under certain circumstances, some pulses may be offset within one series of STI pulses.

Counter 43, which counts to one, serves as a total block at the start of operation when the operating voltage is switched on, in that a voltage dependent reset is effected via line 44. Counter 43 is also started by the output of AND gate 55 and is then locked. In order to additionally synchronize counters 46 and 47 per MPX, the subsequent pulse TP (clock pulse interval pulse) is generated at the output of pulse former 42 which effects resetting via OR gate 61. Pulse TP simultaneously automatically produces a continuous 02 pulse in the form of a logic "1" by setting divider 46 to zero so that information can be retained in the memories over longer periods of time in which nothing is being changed.

It will be understood that the above description of the present invention is susceptible to various modifications, changes and adaptations, and the same are intended to be comprehended within the meaning and range of equivalents of the appended claims.

What is claimed is:

1. In a tuning circuit for a high frequency receiver, which circuit includes a voltage controllable superheterodyne oscillator whose frequency can be varied by a tuning control voltage to produce an oscillation which determines the broadcast frequency to which the receiver is tuned, an optical digital display means for displaying the broadcast frequency to which said receiver is tuned, a counting means for periodically counting the oscillations of said oscillator to produce a count state in the form of representations of the digits of a first decimal number identifying the broadcast frequency to which the receiver is tuned and for supplying same in time multiplex to said display means, input means for generating representations of the digits of a second decimal number identifying the broadcast frequency to which it is desired to tune the receiver, and a comparison circuit means for comparing said first and second decimal number representations and for producing a control voltage for said oscillator from the comparison to cause said first decimal number representation to coincide with said second decimal number representation, said comparison circuit means including a single comparator capable of comparing, at one time, only the representations of one digit of each of said first and second numbers, and a time multiplexing means, responsive to multiplex signals from said counting means, for delivering to said comparator in succession, each digit representation produced by said counting means, starting with the most significant digit, and simultaneously therewith, each digit representation of corresponding significance generated by said input means so that said display means and said comparator are controlled in synchronism; the improvement wherein said time multiplexing means comprises:

a regenerating circuit means for generating the multiplexing signals required for the multiplex operation of said comparison circuit means; first and second means, responsive to output signals from said counting means, for producing and supplying to said regenerating circuit means at least one clock pulse signal appearing per multiplex signal for said display means and a synchronizing signal, respectively, to control said regenerating circuit means; and an auxiliary circuit means, which is responsive to output signals from said counting means, for, together with said regenerating circuit means, controlling the sequence of operation of the entire said comparison circuit means; said comparison circuit means, including said regenerating circuit means, said auxiliary circuit means and said comparator, being designed as a single circuit unit.

2. A tuning circuit as defined in claim 1 wherein said first means for producing said clock pulse signal for said regenerating circuit means is included in said auxiliary circuit means and is connected to said counting means via a single connecting line and responsive to a plurality of control pulses appearing on said line per multiplex signal for said display means.

3. A tuning circuit as defined in claim 1 wherein said second means for producing said synchronizing signal for said regenerating circuit means constitutes a single connecting line connected to an output of said counting means on which appears the multiplex signal for a digit position to be displayed which is displayed on the display means in every mode of operation.

4. A tuning circuit as defined in claim 1 wherein said second means for producing said synchronizing signal for said regenerating circuit is responsive to a gating signal for said counting means which determines the time period during which the oscillations of said oscillator are being counted.

5. A tuning circuit as defined in claim 4 wherein: said second means includes a counter having an input to which is supplied a sequence of clock pulses; and said auxiliary circuit means includes said second means and means for feeding said gating signal to said counter so that said gating signal is effective as said synchronizing signal only for the duration of one multiplex phase.

6. A tuning circuit as defined in claim 5 wherein: said second means further includes an AND gate for linking the output signal from said counter with its input clock pulse signal whereby the output signal from said AND gate constitutes said synchronizing clock pulse; and regenerating circuit means includes a further counter; and means for selectively connecting the clock pulse input of said further counter of said regenerating circuit means to either said output of said AND gate or said clock pulse input of said counter.

7. A tuning circuit as defined in claim 5 wherein said second means includes an AND gate having inputs connected to the output of said counter, to said clock pulse input of said counter and, via an inverter, to the input of said counter to which said gating signal is applied.

8. A tuning circuit as defined in claim 1 wherein: said input means includes an input keyboard with a series connected coder; said counting means produces said first decimal number in the form of a binary code; and said comparison circuit means includes a code converter for converting said first number to the same code as said second number provided by said input means prior to supplying same to said comparator.

9. A tuning circuit as defined in claim 8 wherein: said display means is a seven-segment bar display; the multiplexing signals for said display means are in a seven-segment code; and said code converter is a converter which converts the seven-segment code to a BCD code.

10. A tuning circuit as defined in claim 9 wherein said code converter is controlled only by five of the seven signals provided for said seven-segment display means, and said five signals are selected so that they are able to differentiate between the possible digits.

11. A tuning circuit as defined in claim 1 wherein said regenerating circuit means is a ring counter.

12. A tuning circuit as defined in claim 11 wherein said ring counter is an $n$-stage shift register having a feedback connection from the output of its last stage to the charging input its first stage, where $n$ is the maximum number of digits that can be displayed on said display means; and wherein the outputs of the $n$ stages of said shift register provide said multiplex signals for said comparison circuit means.

13. A tuning circuit as defined in claim 12 wherein said second means comprises means, connected between the $m$-th stage of said shift register and an output of said counting means, for charging said $m$-th stage with the multiplex signal for the $m$-th digit for said display means where $n$ is such a position of the number to be displayed whose digit is always displayed; and wherein said first means includes means for applying a clock pulse to the clock pulse input of said shift register for transferring the memory contents of said $m$-th stage to the next following stage within every multiplex signal for said display device.

14. A tuning circuit as defined in claim 13 wherein said means for applying a clock pulse to the clock pulse input of said shift register with every multiplex signal for said display means is included in said auxiliary circuit means.

15. A tuning circuit as defined in claim 1 wherein said regenerating circuit means comprises a multistage counter whose outputs are connected in parallel to the inputs of a decoder means for providing said multiplex signals required for said comparison circuit means at its outputs.

16. A tuning circuit as defined in claim 15 wherein said counter is a Johnson counter which receives a counting pulse with every multiplex signal for said display means; and said decoder converts the counter state of the counter which is present in the Johnson code, to a "1 to 5 code".

17. A tuning circuit as defined in claim 1 wherein said counting means produces 64 control pulses (STI) on an output line during each multiplex phase and said auxiliary circuit means is connected to said output line and controlled by said 64 control pulses.

18. A tuning circuit as defined in claim 17 wherein said auxiliary circuit means includes means for generating 16 pairs of pulses (01, 02) for a so-called "two-phase operation" of the comparison circuit means from the said 64 control pulses (STI), the first pulse (01) of each said pulse pair constituting an instruction pulse and the second pulse (02) of each said pulse pair constituting an execution pulse and a holding pulse for executing the instruction or holding memory states, respectively.

19. A tuning circuit as defined in claim 18 wherein said auxiliary circuit means further includes: a counter which counts said clock pulses (01) to 16; a control matrix means for producing further clock pulses (T1–T6) from the counter result of said counter; said further clock pulses constituting inter alia, the shift pulses (T2–T5) and the charging pulses (T6) for said comparator.

20. A tuning circuit as defined in claim 1 wherein: said regenerating circuit means includes a counter; said auxiliary circuit means includes said first and said second means; said first means of said auxiliary circuit means includes a series connected divider and a counter for counting control pulses from said counting means to produce said clock pulse for said regenerating circuit means; said second means of said auxiliary circuit means includes means, responsive to a gating signal for said counting means which determines the time period during which the oscillations of said oscillator are being counted, for producing said synchronizing signal; and said auxiliary circuit means further includes a starting state counter means, connected to the output of said second means, for setting said counter of said regenerating circuit means and said counter and divider of said first means to their operating state after the first synchronizing pulse produced by said second means upon initiation of operation of said auxiliary circuit means.

21. A tuning circuit as defined in claim 1 wherein: said regenerating circuit means includes a counter; said auxiliary circuit means includes said first and said second means; said first means of said auxiliary circuit means includes a series connected divider, counter and matrix for counting control pulses from said counting means to produce said clock pulse for said regenerating circuit means; said second means of said auxiliary circuit means comprises means, including a counter, responsive to a gating signal for said counting means which determines the time period during which the oscillations of said oscillator are being counted and to the clock pulse output of said matrix, for producing said synchronizing signal for said regenerating circuit means; and said auxiliary circuit means further includes means responsive to the output signals from said counting means which represent the individual digits of said first number for forming interval clock pulses (B1–B6) between the multiplex phases, and means responsive to said interval clock pulses for providing a reset signal for said counter and divider of said first means and said counters of said second means and said regenerating circuit means.

22. A tuning circuit as defined in claim 1 wherein the entire said comparison circuit means included said auxiliary circuit means and said regenerating circuit means are designed as an integrated circuit.

* * * * *